(12) United States Patent
Tamaki et al.

(10) Patent No.: US 6,661,318 B2
(45) Date of Patent: Dec. 9, 2003

(54) RADIO FREQUENCY CIRCUIT MODULE ON MULTI-LAYER SUBSTRATE

(75) Inventors: Naoya Tamaki, Tokyo (JP); Norio Masuda, Tokyo (JP)

(73) Assignee: NEC Corporation, Tokyo (JP)

( * ) Notice: Subject to any disclaimer, the term of this patent is extended or adjusted under 35 U.S.C. 154(b) by 127 days.

(21) Appl. No.: 09/850,062

(22) Filed: May 8, 2001

(65) Prior Publication Data

US 2001/0042907 A1 Nov. 22, 2001

(30) Foreign Application Priority Data

May 9, 2000 (JP) ...................................... 2000-136216

(51) Int. Cl.⁷ ................................................ H01P 5/08
(52) U.S. Cl. ........................................ 333/260; 333/33
(58) Field of Search ........................... 333/246, 33, 34, 333/260

(56) References Cited

U.S. PATENT DOCUMENTS

| | | | | |
|---|---|---|---|---|
| 3,201,722 A | * | 8/1965 | May et al. ..................... 333/33 |
| 4,326,180 A | * | 4/1982 | Ferri ........................... 333/246 |
| 4,867,704 A | | 9/1989 | Standke ....................... 439/581 |
| 4,930,215 A | | 6/1990 | Roche et al. ................... 29/830 |
| 5,469,130 A | * | 11/1995 | Okada et al. ............... 333/246 |
| 5,532,659 A | | 7/1996 | Dodart ......................... 333/260 |
| 5,613,859 A | | 3/1997 | Bellantoni et al. ............ 439/63 |

FOREIGN PATENT DOCUMENTS

| | | |
|---|---|---|
| FR | 2 551 269 | 3/1985 |
| JP | 60-182801 | 9/1985 |
| JP | 02-234501 | 9/1990 |
| JP | 05-235613 | 9/1993 |
| JP | 06-112707 | 4/1994 |
| JP | 06-350312 | 12/1994 |
| JP | 10-145114 | 5/1998 |
| JP | 11-308018 | 11/1999 |

* cited by examiner

Primary Examiner—Robert Pascal
Assistant Examiner—Stephen E. Jones
(74) Attorney, Agent, or Firm—Young & Thompson (57) ABSTRACT

An object of the present invention is to provide a radio frequency integrated circuit module that is less susceptible to the electromagnetic influence and that is not degraded in electric connection. The radio frequency circuit module of the present invention including circuit elements mounted on a multi-layer circuit substrate having dielectric layers is characterized in that an exposed connection portion is provided by removing a part of the dielectric, and a strip line connected to said circuit elements and a co-axial line for transmitting a radio frequency signal from/to said strip line are connected together in a bottom portion of said exposed connection portion so as to be rectilinear in a three dimensional way.

5 Claims, 13 Drawing Sheets

RADIO FREQUENCY CIRCUIT MODULE ON MULTI-LAYER SUBSTRATE

BACKGROUND OF THE INVENTION

1. Technical Field of the Invention

The present invention relates to a radio frequency circuit module, such as monolithic radio frequency integrated circuit module or a hybrid microwave integrated circuit module, formed by mounting circuit elements on a circuit substrate having dielectric layers for a module and a communication apparatus using the radio frequency circuit.

2. Description of the Prior Art

Heretofore, there is a radio frequency integrated circuit module having a multi-layer circuit substrate, on which circuit elements such as active elements including transistors and diodes and passive elements including resistors and inductors, and wiring for mutually connecting the circuit elements are mounted. When radio frequency integrated circuit module are mutually connected, a transmission path having a high shield property, such as a coaxial line, is used between transmission and reception terminals in many cases.

Figure 16A:
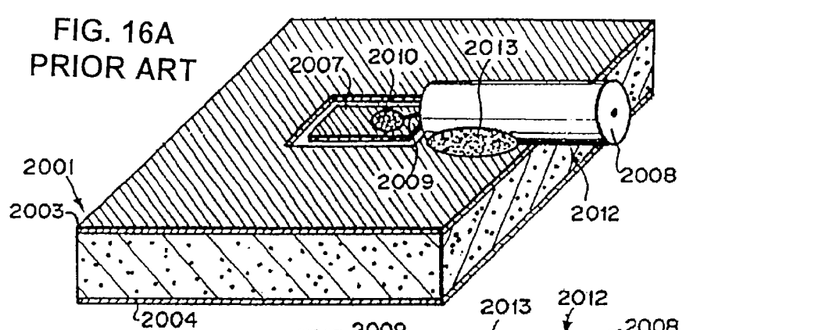
FIGS. 16A and 16B are illustrative views of vicinities of transmission and reception terminals of a radio frequency integrated circuit module of the prior art.
Figure 16B:
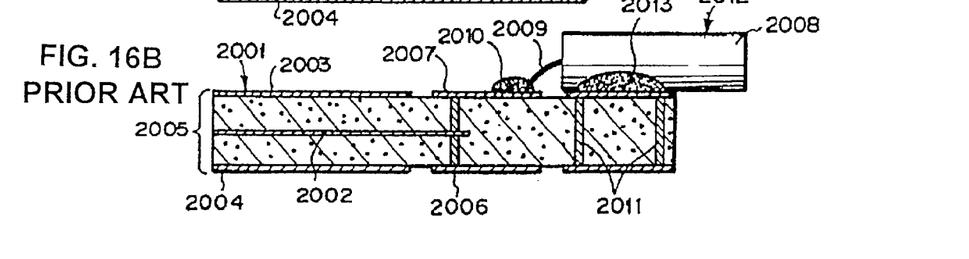

FIG. 16A is an oblique view conceptually showing the vicinities of transmission and reception terminals of a conventional radio frequency integrated circuit module. FIG. 16 B is a sectional view of FIG. 16A in a coaxial line direction. FIG. 16B shows a radio frequency integrated circuit module having a multi-layer circuit substrate 2001 formed by interposing an inner conductor 2002 having circuit elements mounted thereon, between first and second grounds 2003 and 2004 to form a strip line 2005.

The inner conductor 2002 is led to a pad 2007 through a via (through hole) 2006. The pad 2007 is a transmission and reception terminal having a fixed area provided on a top layer or a bottom layer. A central conductor 2009 of a coaxial line 2008 is fixed to the pad 2007 by adhering using solder 2010. Furthermore, the first and second grounds 2003 and 2004 are electrically connected through vias 2011. An outer conductor 2012 of the coaxial line 2008 is adhered and fixed to the first ground 2003 by solder 2013.

Radio frequency signals can be inputted to and outputted from the radio frequency integrated circuit module of such construction in such a state that circuit elements are integrated therein.

In the conventional radio frequency integrated circuit module, however, the central conductor of the coaxial line to be shielded around it is exposed at a portion connected to the pad. Therefore, the central conductor is susceptible to electromagnetic waves radiated from circuit elements and wiring mounted near the central conductor or external electromagnetic noise.

Furthermore, in some cases, for example, the central conductor of the coaxial line is pulled from the outside and consequently a warp is caused in the multi-layer circuit substrate, or stress from a contained cabinet is applied to the coaxial line. Sometimes in this case, solder peels from the pad or ground, or a metal pattern peels from the multi-layer circuit substrate, and resultant wire breaking or poor connection degrades the electric connection state.

Furthermore, there is a disadvantage that an unnecessary inductance component increases because the via is provided to connect the inner conductor, and consequently the radio frequency characteristics are degraded. Furthermore, since the central conductor of the axial line is not connected to the inner conductor in a three-dimensional rectilinear way, the electromagnetic field near the via is disturbed and the transmission characteristics of the radio frequency signal are degraded in some cases.

SUMMARY OF THE INVENTION

A problem of the present invention is to provide a radio frequency integrated circuit that is not susceptible to the influence of the electromagnetic waves and that is not degraded in electrical connection state, and a radio frequency integrated circuit module and a communication apparatus having the radio frequency integrated circuit mounted thereon.

In order to solve the above described problem, the present invention is a radio frequency circuit including circuit elements mounted on a multi-layer circuit substrate having a dielectric, characterized in that an exposed connection portion is provided by removing a part of the dielectric, and a conductor line connected to the circuit elements and a transmission path for transmitting a radio frequency signal from/to the conductor line are connected together in a bottom portion of the exposed connection portion so as to be rectilinear in a three dimensional way.

To be concrete, the exposed connection portion is disposed in such a position as to be less susceptible to influence of electromagnetic waves from the circuit elements. Furthermore, preferably, a connection portion of the conductor line and the transmission path is covered by a conductor having such a hole as to be able to take out the transmission path. In addition, the conductor line is formed in a taper form toward the connection portion of the conductor line and the transmission path. Furthermore, ceramic or alumina can be used as the dielectric.

Furthermore, to be concrete, the conductor line and the transmission path are connected together so as to be rectilinear in a three dimensional way by providing a step in the bottom portion of the exposed connection portion. Furthermore, a part of the bottom portion of the exposed connection portion is a surface of ground, and an outer conductor of the transmission path is electrically connected to the ground. Furthermore, characteristic impedance matching in the connection portion can also be accomplished by changing the distance between the conductor and the connection portion of the conductor line and the transmission path or by changing the thickness of a dielectric of the multi-layer circuit substrate disposed across the connection portion of the conductor line and the transmission path from the exposed connection portion.

Furthermore, the present invention is a module including a radio frequency circuit, the radio frequency circuit including circuit elements mounted on a multi-layer circuit substrate having a dielectric, characterized in that in the radio frequency circuit, an exposed connection portion is provided by removing a part of the dielectric, and a conductor line connected to the circuit elements and a transmission path for transmitting a radio frequency signal to the conductor line are connected together in a bottom portion of the exposed connection portion so as to be rectilinear in a three dimensional way.

Furthermore, a communication apparatus of the present invention is characterized in that the module is mounted on a radio frequency signal processor.

Furthermore, in the radio frequency circuit of the present invention, a multi-layer circuit substrate is formed of at least three layers including first to Nth (N≧3) layers. Such a strip line that an inner conductor disposed in some inner layer is interposed between first and second grounds has an exposed connection portion in its end portion. The exposed connection portion is formed by removing a dielectric layer or a metal layer on an upper side or a lower side of the inner conductor. A central conductor of a coaxial line serving as a transmission path is connected to the inner conductor exposed in the bottom portion of the exposed connection portion so as to be rectilinear. The characteristic impedance of the strip line is made equal to that of the coaxial line.

According to the present invention, the transmission characteristic of the connection portion between the inner conductor in the multi-layer circuit substrate and the coaxial line can be improved, and highly reliable signal transmission with a reduced reflection loss and radiation loss can be conducted. Furthermore, the shield performance in the connection portion between the inner conductor and the coaxial line can be improved. It is possible to suppress the interference of electromagnetic noise in the surroundings and conduct highly reliable signal transmission without radiating unnecessary electromagnetic waves to the surroundings.

Furthermore, the mechanical strength in the connection portion between the inner conductor in the multi-layer circuit substrate and the coaxial line can be enhanced. It is possible to prevent wire breaking or poor connection caused by deformation of the connection portion or signal degradation caused thereby. Highly reliable signal transmission can be conducted.

PREFERRED EMBODIMENT OF THE INVENTION (First Embodiment)

Figure 1A:
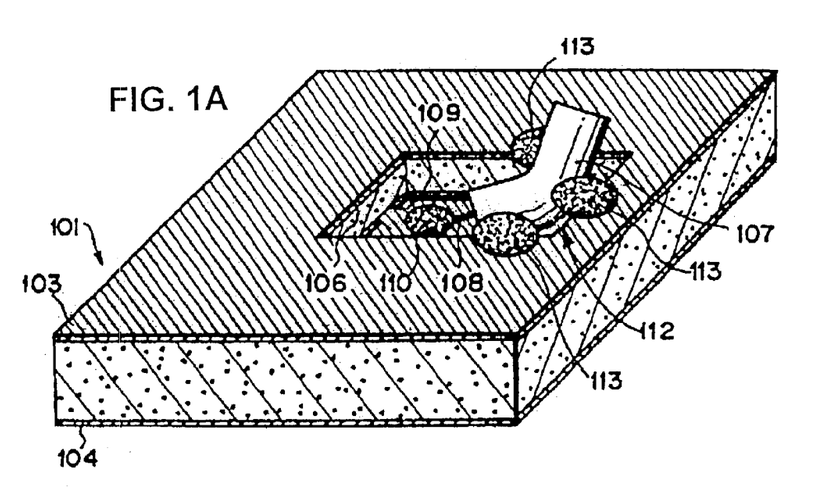
FIGS. 1A and 1B are an oblique view and a sectional view, respectively, of a radio frequency integrated circuit module of a first embodiment according to the present invention.
Figure 1B:
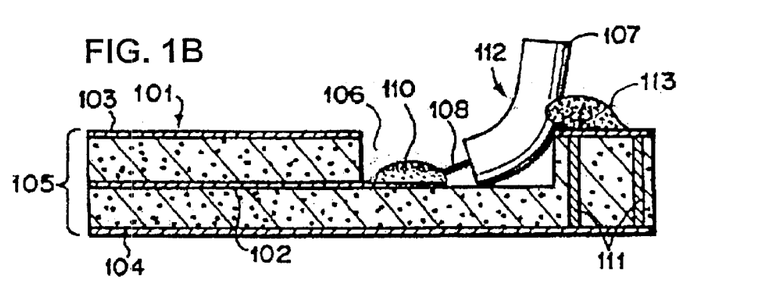

FIG. 1A is an oblique view conceptually showing a radio frequency integrated circuit module of a first embodiment according to the present invention. FIG. 1B is a sectional view of FIG. 1A in a coaxial line direction. FIG. 1B shows a radio frequency integrated circuit module having a multi-layer circuit substrate 101 with a double layer structure formed by interposing an inner conductor 102 serving as a conductor line between first ground 103 and second ground 104 which form a strip line 105.

On the first ground 103 side of the multi-layer circuit substrate 101, a cavity shaped exposed connection portion 106 is provided. In the exposed connection portion 106, the dielectric layer or the metal layer is not provided, but an exposed portion of a central conductor 108 of a semi-rigid coaxial line (hereafter referred to as "coaxial line") 107 is fixed in such a manner that the coaxial line 107 is not affected by electromagnetic waves generated from circuit elements mounted around it.

As shown in FIG. 1A, a square exposed connection portion 106 is formed. For example, however, the exposed connection portion 106 may be a circle. The shape is not restricted to a square. The exposed connection portion 106 can be formed by etching or mechanical cutting.

In other words, the exposed connection portion 106 is provided in such a position that the exposed portion of the central conductor 108 of the coaxial line 107 is not affected by electromagnetic waves generated from circuit elements mounted around it. Adhering and fixing is conducted by using solder 110 so that the exposed central conductor 108 and the exposed portion 109 of the inner conductor 102 may become nearly rectilinear.

Furthermore, the first ground 103 and the second ground 104 are electrically connected by vias 111 provided at near end portions of the strip line 105. In addition, an outer conductor 112 is fixed to the first ground 103 by solder 113. The solders 110 and 113 may include lead or may not include lead.

As the dielectric, ceramic or alumina can be used. Here, ceramic is used. The dielectric constant of the dielectric is set equal to, for example, 7.1. The thickness of the dielectric is set equal to, for example, 0.12 mm in each of the first and second grounds. Furthermore, the width and thickness of the inner conductor 102 are set equal to 0.05 mm and 0.01 mm, respectively. Thus, the characteristic impedance of the exposed connection portion 106 is set equal to approximately 50 Ω which is the characteristic impedance of the strip line 105 and the coaxial line 107.

By the way, by using ceramics as the dielectric, the fabrication precision can be raised as compared with the multi-layer circuit substrate made of FR4 that is generally widespread, and reliability of the transmission characteristics can be improved especially in a GHz band.

The exposed portion 109 is made large enough to adhere the central conductor 108 of the coaxial line 107 serving as the transmission path to the exposed portion 109 by using the solder 110. For example, as shown in FIG. 11, it is desirable to form the inner conductor 102 in a tapered form toward the exposed portion 109.

Figure 11:
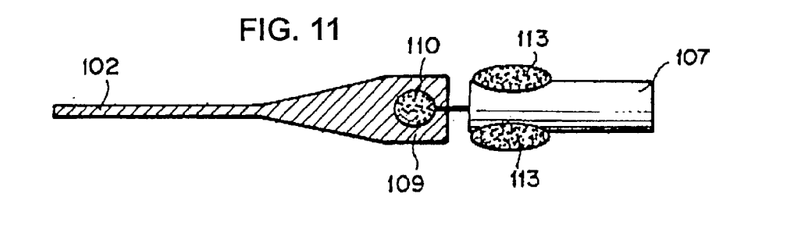
FIG. 11 is a top view showing a taper shaped inner conductor.

FIG. 11 is a top view conceptually showing a portion of the inner conductor 102 in the vicinity of the exposed connection portion. This is because an impedance matching in the radio frequency band is in general difficult in a line rapidly changing in conductor width and resultant unnecessary reflection might degrade the radio frequency reflection characteristics.

Concretely, when, for example, the width of the inner conductor 102 is approximately 0.1 mm, the width is gradually widened from a position located at a distance of approximately 1.5 mm from the exposed portion 109 and the width is made approximately 0.5 mm in the exposed portion 109. When the width of the inner conductor 102 is wider than that of the exposed portion 109, the width of the inner conductor 102 should be gradually narrowed from a position located at a distance of approximately 1.5 mm from the exposed portion 109 to form a tapered shape.

In the present embodiment, the exposed connection portion 106 is provided and circuit elements are not formed near the central conductor 108 of the coaxial line 107. Thus, the exposed portion of the central conductor 108 is made less susceptible to the influence of electromagnetic waves. Furthermore, since the solder 110 is provided within the exposed connection portion 106, the solder 110 is prevented from peeling off due to external force.

Furthermore, since the central conductor 108 of the coaxial line 107 is fixed to the inner conductor 102 so as to be rectilinear, the central conductor 108 can be electrically connected to the end portion of the inner conductor 102. Furthermore, since the inner conductor 102 is directly connected to the central conductor 108 of the coaxial line 107, a radio frequency integrated circuit module can be formed without hampering the impedance matching.

Furthermore, in the present embodiment, the outer conductor 112 is adhered to the first ground 103 in three places by solder 113. Therefore, they can be connected together directly and firmly.

(Second Embodiment)

Figure 2A:
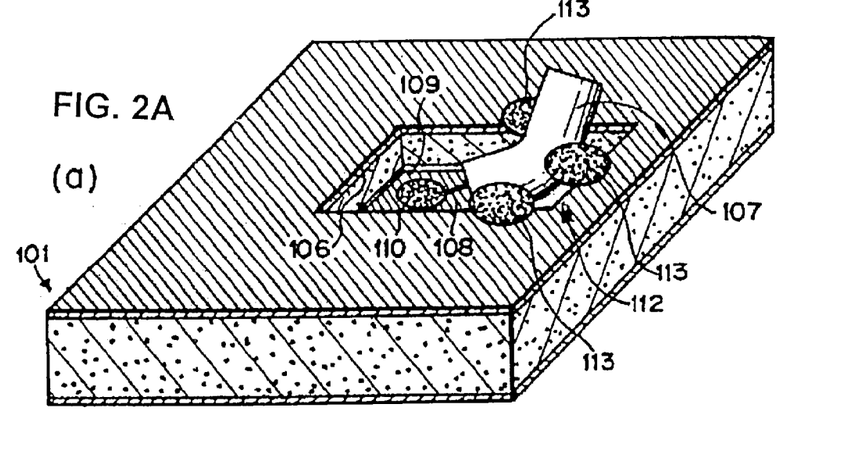
FIGS. 2A and 2B are an oblique view and a sectional view, respectively, of a radio frequency integrated circuit module of a second embodiment according to the present invention.
Figure 2B:
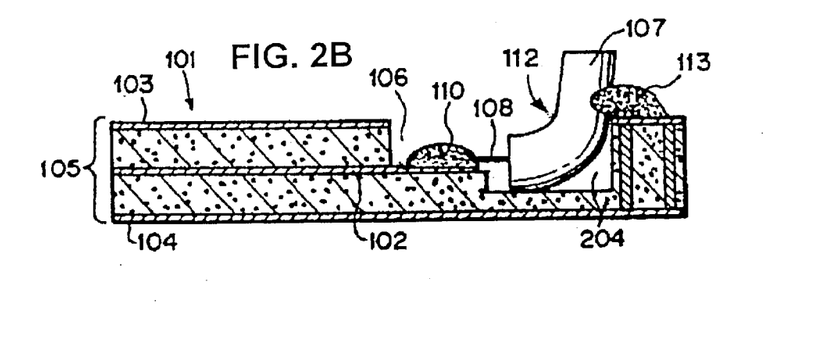

FIG. 2A is an oblique view conceptually showing a radio frequency integrated circuit module of a second embodiment according to the present invention. FIG. 2B is a sectional view of FIG. 2A in a coaxial line direction. In FIG. 2A, numeral 204 denotes an exposed connection portion provided in order to structurally make it hard to burden a load on the coaxial line 107. In FIG. 2A, the same components as those shown in FIG. 1A are denoted by like characters.

In the present embodiment, a step between an exposed connection portion 106 and an exposed connection portion 204 is set equal to the radius of an outer conductor 112. As a result, the stress caused by bending the coaxial line 107 is eliminated. In its turn, the load applied to solder 113 can be reduced. It becomes possible to make the solder 113 hard to peel from the first ground 103. As compared with the radio frequency integrated circuit module shown in FIG. 1A, therefore, degradation of electric connection state can be further prevented. Reliability of the microwave transmission characteristics can also be improved.

(Third Embodiment)

Figure 3A:
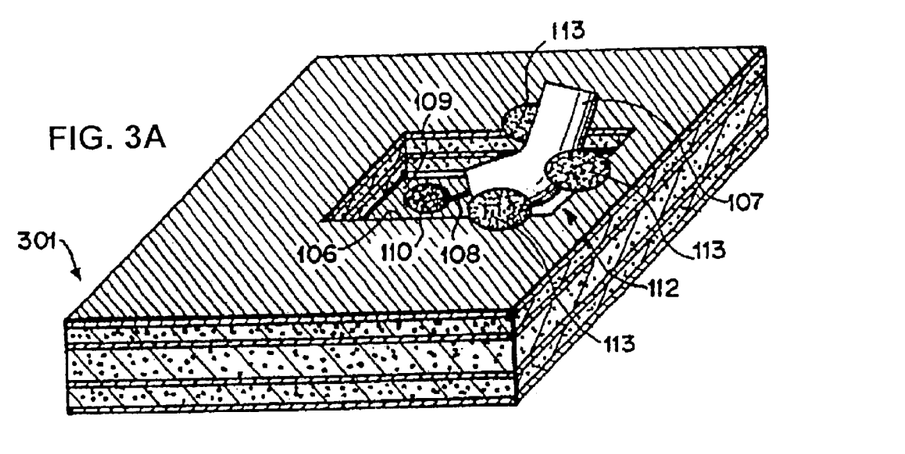
FIGS. 3A and 3B are an oblique view and a sectional view, respectively, of a radio frequency integrated circuit module of a third embodiment according to the present invention.
Figure 3B:
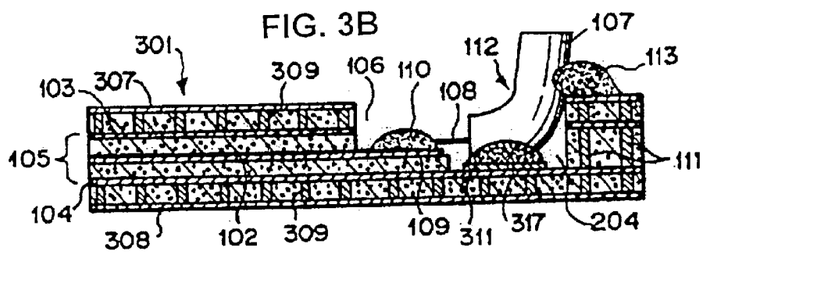

FIG. 3A is an oblique view conceptually showing a radio frequency integrated circuit module of a third embodiment according to the present invention. FIG. 3B is a sectional view of FIG. 3A in a coaxial line direction. In the present embodiment, a multi-layer circuit substrate 301 of a five layer structure is used.

In FIG. 3A, numerals 307, 308 and 311 denote third to fifth grounds. Numerals 309 denote vias provided at a high density in a two dimensional way to connect the first and third grounds together and connect the second and fourth grounds together. Numeral 317 denotes solder for connecting an outer conductor 112 to the fifth ground 311.

In FIG. 3A, the same portions as those shown in FIG. 2A are denoted by like characters. The present embodiment has been described by taking the case where the fifth ground 311 is provided, as an example. However, the outer conductor 112 and the second ground 104 may be directly connected together by solder 317.

Even if the multi-layer circuit substrate 301 of, for example, the five layer structure is used as in the present embodiment, degradation of the electric connection state can be prevented in the same way as the second embodiment. Reliability of the microwave transmission characteristics is also improved.

(Forth Embodiment)

Figure 4A:
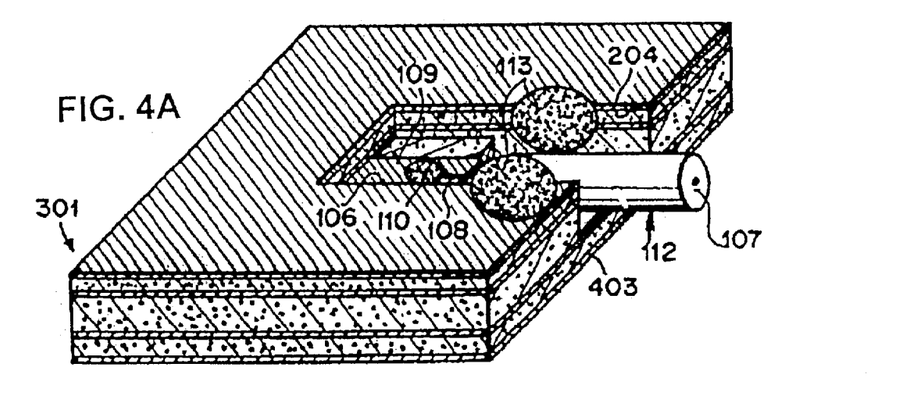
FIG. 4A is an oblique view of a forth embodiment.
Figure 4B:
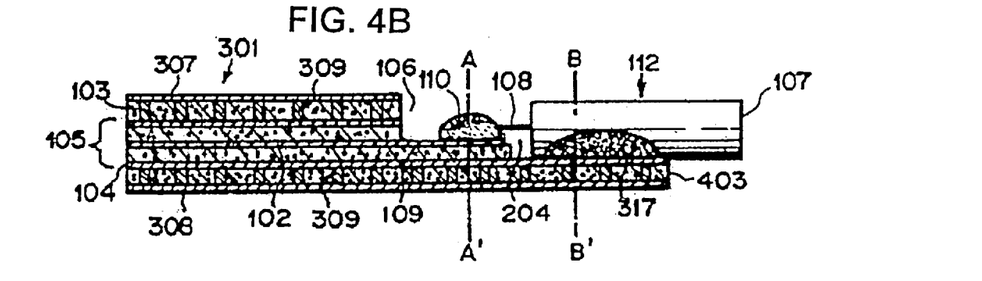
FIGS. 4B to 4D are sectional view thereof.
Figure 4C:
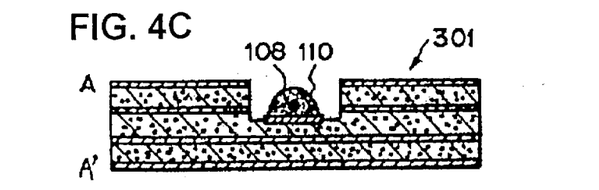
Figure 4D:
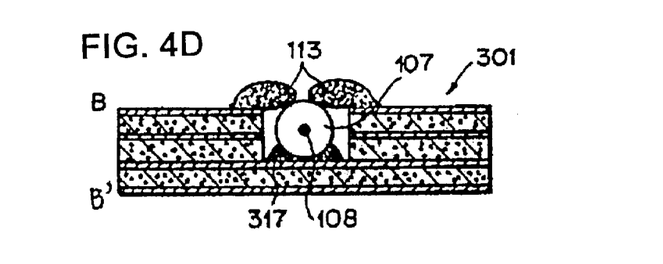

FIG. 4A is an oblique view conceptually showing a radio frequency integrated circuit module of a forth embodiment according to the present invention. FIG. 4B is a sectional view of FIG. 4A in a coaxial line direction. FIG. 4C is a sectional view of FIG. 4B in an A–A' plane. FIG. 4D is a sectional view of FIG. 4B) in a B–B' plane. In FIG. 4A, numeral 403 denotes an end portion of the multi-layer circuit substrate 301. In FIG. 4A, the same portions as those shown in FIG. 3A are denoted by like characters.

In the present embodiment, side faces of the exposed connection portion 204 are provided on the end portion 403 of the multi-layer circuit substrate 301. In the end portion 403 of the radio frequency integrated circuit module, a central conductor 108 of a coaxial line 107 is connected to an exposed portion 109 of an inner conductor 102. As a result, the coaxial line 107 is not bent. As compared with the radio frequency integrated circuit module shown in FIG. 3A, the load applied to solder 113 can be further reduced.

In the radio frequency integrated circuit modules shown in FIGS. 1A to 3B as well, the exposed connection portion 106 may be formed in the end portion of the radio frequency integrated circuit module.

(Fifth Embodiment)

Figure 5A:
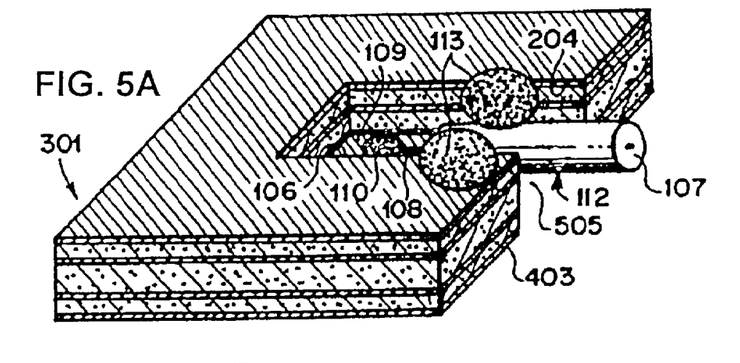
FIG. 5A is an oblique view of a fifth.
Figure 5B:
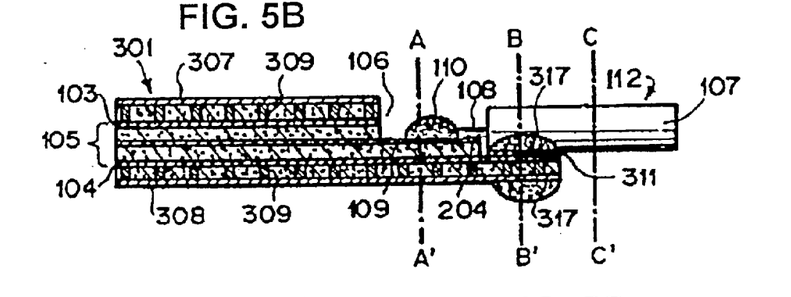
FIGS. 5B to 5E are sectional view thereof.
Figure 5C:
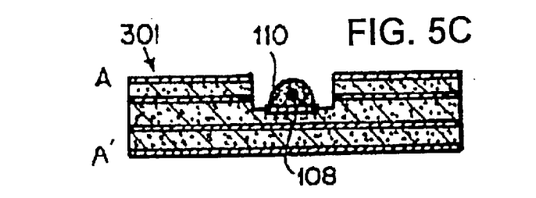
Figure 5D:
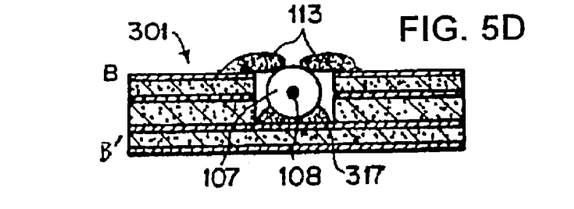
Figure 5E:
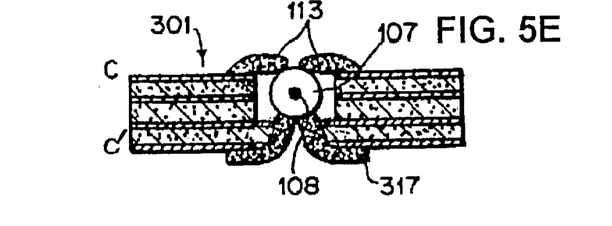

FIG. 5A is an oblique view conceptually showing a radio frequency integrated circuit module of a fifth embodiment according to the present invention. FIG. 5B is a sectional view of FIG. 6A in a coaxial line direction. FIG. 5C is a sectional view of FIG. 5B in an A–A' plane. FIG. 5d is a sectional view of FIG. 5B in a B–B' plane. FIG. 5E is a sectional view of FIG. 5 B in a C–C' plane.

In FIG. 5A, numeral 505 denotes a notch of an end portion 403. The same portions as those shown in FIG. 4A are denoted by like characters. By providing the notch 505, it is possible in the present embodiment to fix a fourth ground 308 and an outer conductor 112 by using solder 317 as shown in FIG. 5C. As compared with the radio frequency integrated circuit module shown in FIG. 4A, firmer mechanical connection can be accomplished.

(Sixth Embodiment)

Figure 6A:
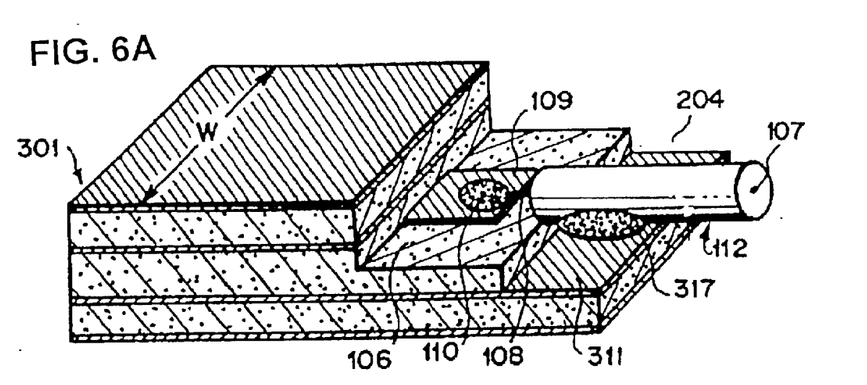
FIGS. 6A and 6B are an oblique view and a sectional view, respectively, of a radio frequency integrated circuit module of a sixth embodiment according to the present invention.
Figure 6B:
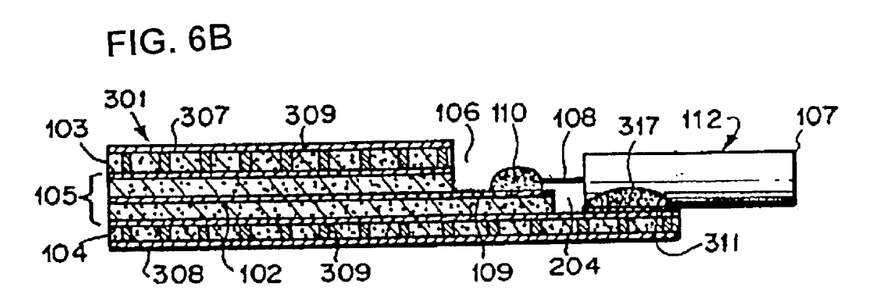

FIG. 6A is an oblique view conceptually showing a radio frequency integrated circuit module of a sixth embodiment according to the present invention. FIG. 6B is a sectional view of FIG. 6A in a coaxial line direction. In the present embodiment, the width W of the multi-layer circuit substrate 301 is made equal to the width of the exposed connection portions 106 and 204. In FIG. 6A, the same portions as those shown in FIG. 5A are denoted by like characters. By the way, the width W is set equal to approximately 2 mm.

When the exposed connection portions 106 and 204 of the radio frequency integrated circuit module as shown in FIG. 6A are formed by mechanical cutting, forming is easier than the exposed connection portion 106 shown in FIGS. 1A to 5E.

(Seventh Embodiment)

Figure 7A:
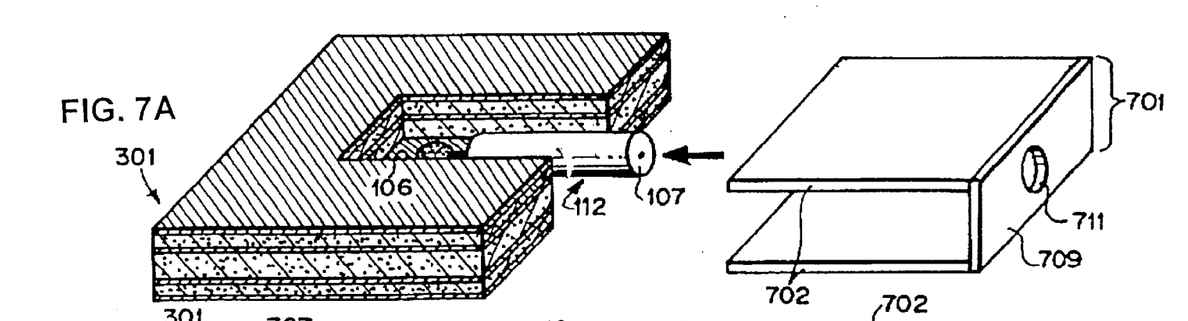
FIGS. 7A to 7C are illustrative views of a U-shaped metal casing for covering the radio frequency integrated circuit module shown in FIG. 5A and the vicinities of transmission and reception terminals thereof.
Figures 7B, 7C:
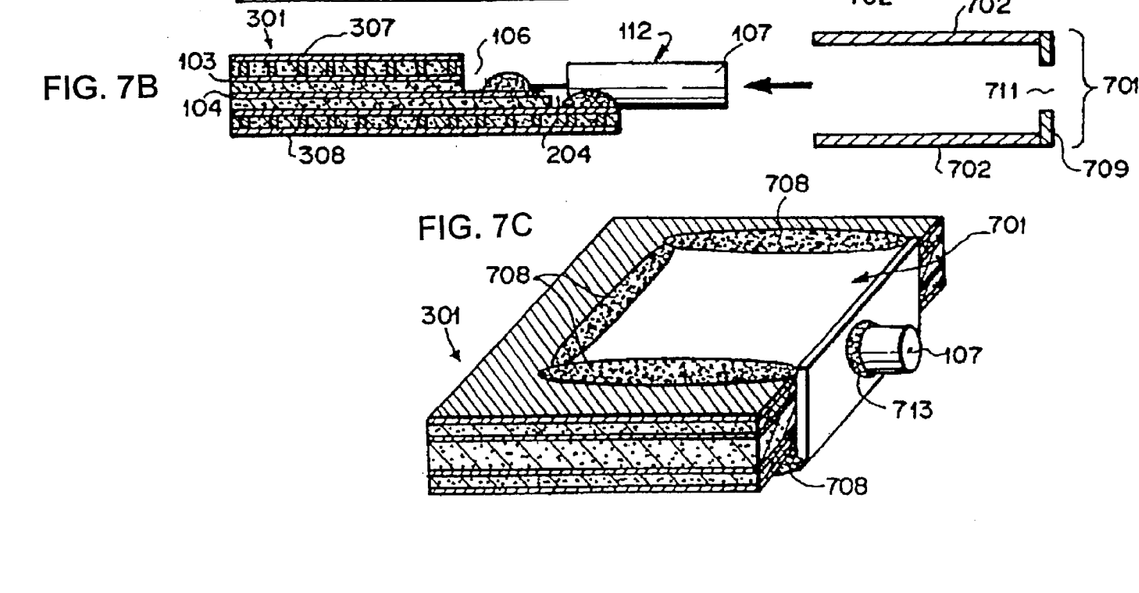

FIG. 7A is an oblique view of the radio frequency integrated circuit module shown in FIG. 5A and a metal case made of, for example, copper that is a conductor case for covering the vicinities of transmission and reception terminals of the radio frequency integrated circuit module. FIG. 7B is a sectional view of FIG. 7A in a coaxial line direction. FIG. 7C is an illustrative view showing such a situation that a metal case 701 in the state of FIG. 7A is attached to the radio frequency integrated circuit module and they are adhered and fixed to each other by soldering.

In FIG. 7A, the metal case 701 includes two parallel flat metal plates 702 and a flat metal plate 709 having a hole 711 for passing a coaxial line 107. The interval between the two parallel flat metal plates 702 is set nearly equal to the thickness of the multi-layer circuit substrate 301. Furthermore, the width of the flat metal plate 702 is made larger than the width of the exposed connection portions 106 and 204. Conductive resin such as conductive plastic or resin having metal plating on the surface thereof may be used as the case 701. By the way, the same portions as those shown in FIG. 6A are denoted by like characters in FIG. 7A.

As shown in FIG. 7C, in the present embodiment, the coaxial line 107 is passed through the hole 711 and then the metal case 701 is attached to the radio frequency integrated circuit module. Third and fourth grounds 307 and 308 and the flat metal plates 702 are adhered and fixed to each other by solder 708. The coaxial line 107 and the hole 711 are adhered and fixed to each other by solder 713.

As a result, the coaxial line 107 is fixed to the metal case 701. When a tension force is applied from the outside to a cabinet containing the radio frequency integrated circuit module, the force is not applied directly to the solder 110 and 113. Accordingly, the solder 110 and 113 and the metal pattern are not easily peeled off.

In addition, the metal case 701 electromagnetically shields the inner conductor 102 and the central conductor 108 of the coaxial line 107. It thus becomes possible to make a radio frequency signal less susceptible to external electromagnetic noise and make the radio frequency signal generate less electromagnetic noise to the outside. In addition, fine metallic powders are prevented from contacting with the exposed central conductor 108 of the coaxial line 107.

Figures 8A, 8B:
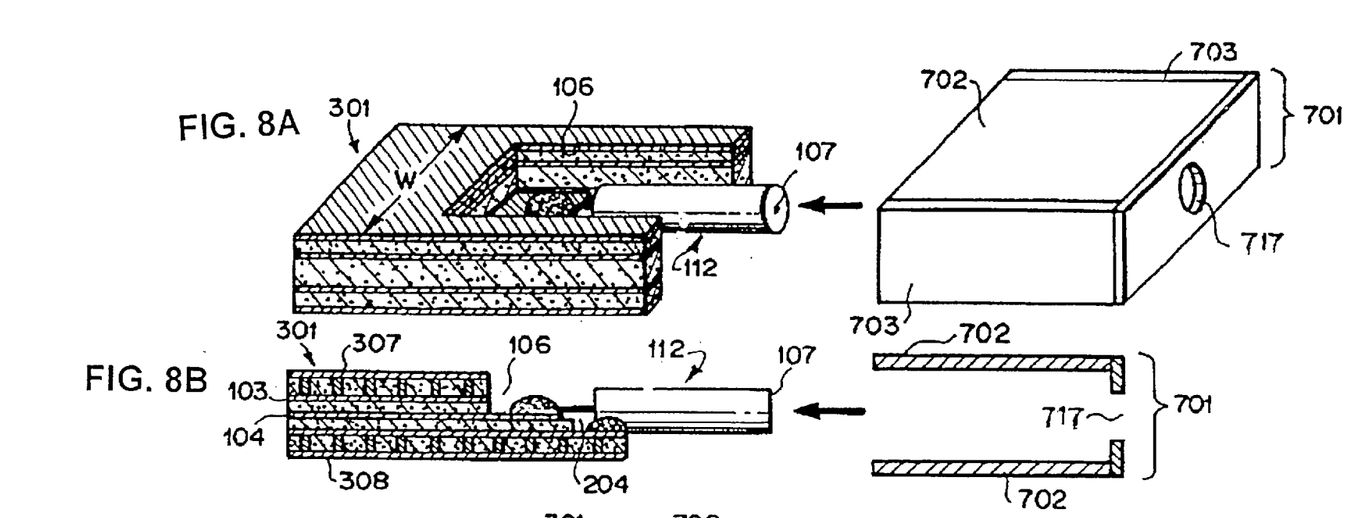
FIGS. 8A to 8C are illustrative views of a metal case of box shape for covering the radio frequency integrated circuit module shown in FIG. 5A and the vicinities of transmission and reception terminals thereof.
Figure 8C:
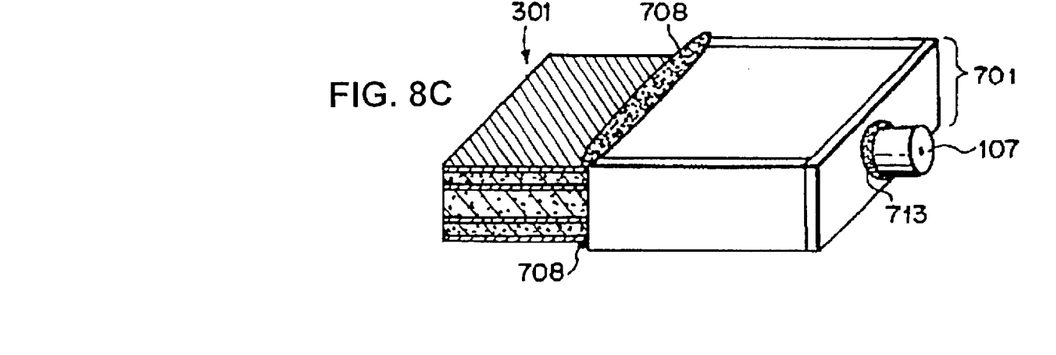
Figure 9A:
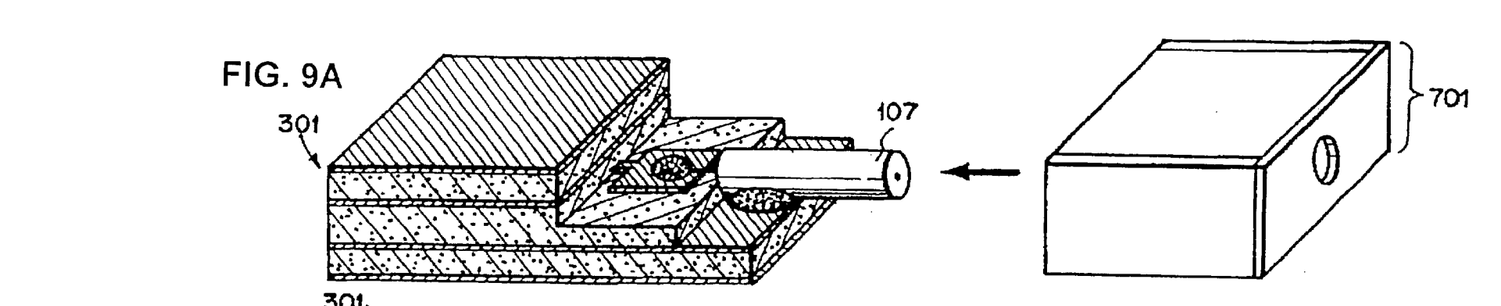
FIGS. 9A to 9C are illustrative views of a metal case of box shape for covering the radio frequency integrated circuit module shown in FIG. 6A and the vicinities of transmission and reception terminals thereof.
Figure 9B:
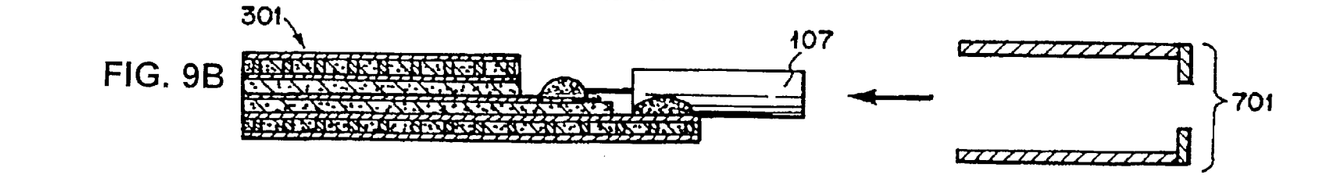
Figure 9C:
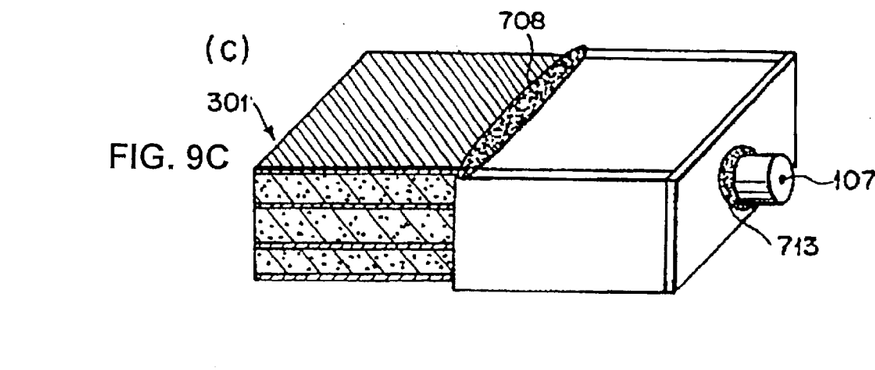

In FIG. 7A, the metal case 701 is U-shaped. As shown in FIG. 8A, however, the metal case 701 may be of box shape. Furthermore, it is also possible to use, for example, the radio frequency integrated circuit module shown in FIG. 6A and combine it with the metal case 701 taking the shape of box shape as shown in FIG. 9A. By the way, the metal case 701 shown in FIG. 7A is suitable, when the width of the radio frequency integrated circuit module is long.

On the other hand, the metal case 701 as shown in FIGS. 8A and 9A can surround the exposed portion 109 and the central conductor 108 of the coaxial line 107 on all sides. As compared with the case where the metal case 701 shown in FIG. 7A is used, therefore, it becomes possible to make the module less susceptible to external electromagnetic noise and make the module hardly transmit electromagnetic noise to the outside.

Each of the radio frequency integrated circuit modules shown in FIGS. 1A to 6B may have such a configuration as to be covered by the metal case 701.

Figure 10:
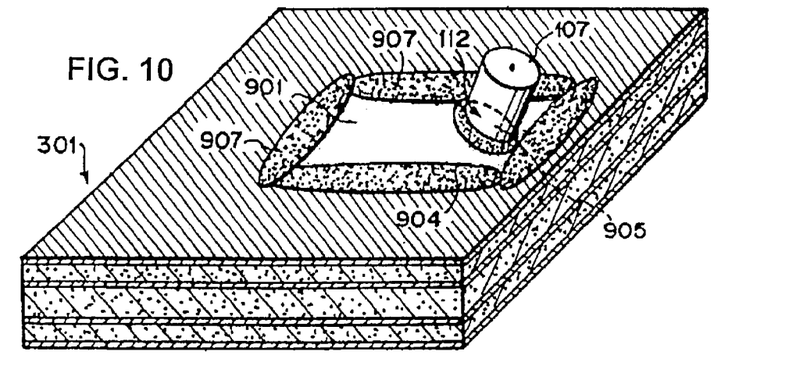
FIG. 10 is an oblique view showing such a state that the top of an exposed connection portion of the radio frequency integrated circuit module shown in FIG. 3A has been covered by a flat metal plate.

FIG. 10 is an oblique view showing such a state that the top of the exposed connection portion 106 of the radio frequency integrated circuit module shown in FIG. 3A is covered by a flat metal plate 901. The flat metal plate 901 includes a hole 905 having a diameter that is nearly equal to the outer diameter of the coaxial line 107. The coaxial line 107 is passed through the hole 905. The flat metal plate 901 and the coaxial line 107 are adhered and fixed to each other by solder 904. In addition, the flat metal plate 901 and the radio frequency integrated circuit module are adhered and fixed to each other by solder 907.

According to the present embodiment, favorable electric connection between the first and second grounds 103 and 104 and the outer conductor 112 can be ensured in the same way as the seventh embodiment. In addition, the module can be made less susceptible to external electromagnetic noise.

Each of the radio frequency integrated circuit modules shown in FIGS. 1A to 6B may have such a configuration as to be covered by the flat metal plate 901.

(Ninth Embodiment)

Figure 12A:
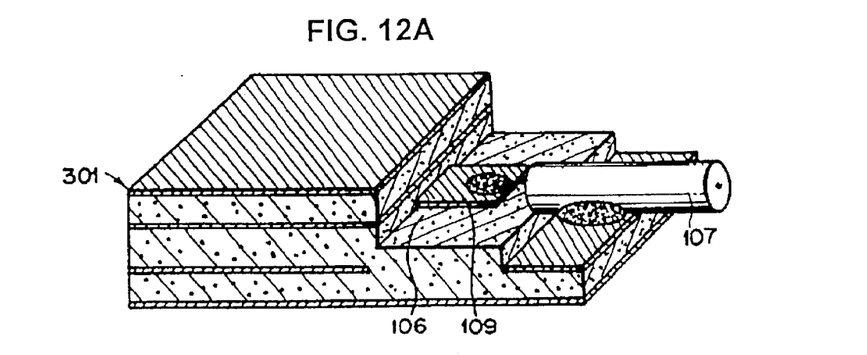
FIGS. 12A and 12B are illustrative views and a sectional view of a radio frequency integrated circuit module of a ninth embodiment according to the present invention.
Figure 12B:
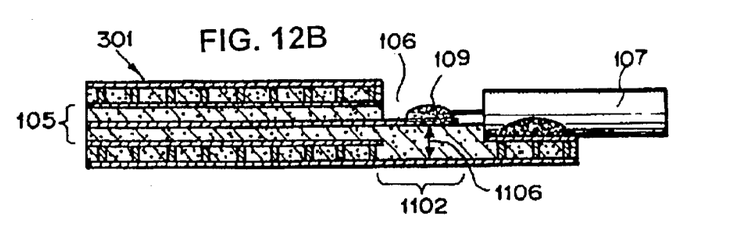

FIG. 12A is an oblique view conceptually showing a radio frequency integrated circuit module of a ninth embodiment according to the present invention. FIG. 12B is a sectional view of FIG. 12A in a coaxial line direction. In the present embodiment, there will be described a technique for making the characteristic impedance of the typically used strip line 105 and the coaxial line 107 equal to approximately 50 Ω.

As described with reference to the first embodiment, the characteristic impedance of the strip line 105 can be adjusted by changing the dielectric constant and thickness of the dielectric and the width and thickness of the inner conductor 102.

Because of a demand for size reduction of the radio frequency integrated circuit module, however, the thickness and so on of the dielectric cannot be changed in some cases. By removing the second ground 104 in such a section 1102 that the exposed connection portion 106 exists therein so as to make the characteristic impedance in the section 1102 equal to the characteristic impedance of the strip line 105 and the coaxial line 107, therefore, the width of the inner conductor 102 and the thickness of the dielectric that is in contact with the inner conductor, in the section 1102 are altered.

Even when the thickness and so on of the dielectric cannot be changed, therefore, the characteristic impedance of the strip line 105 and the coaxial line 107 can be matched and impedance matching in the design stage is facilitated, in the present embodiment. Furthermore, the distributed parameter design of each ground is also facilitated. As a result, unnecessary reflection and radiation can be suppressed, and reliability of the transmission characteristics can be improved.

(Tenth Embodiment)

Figure 13A:
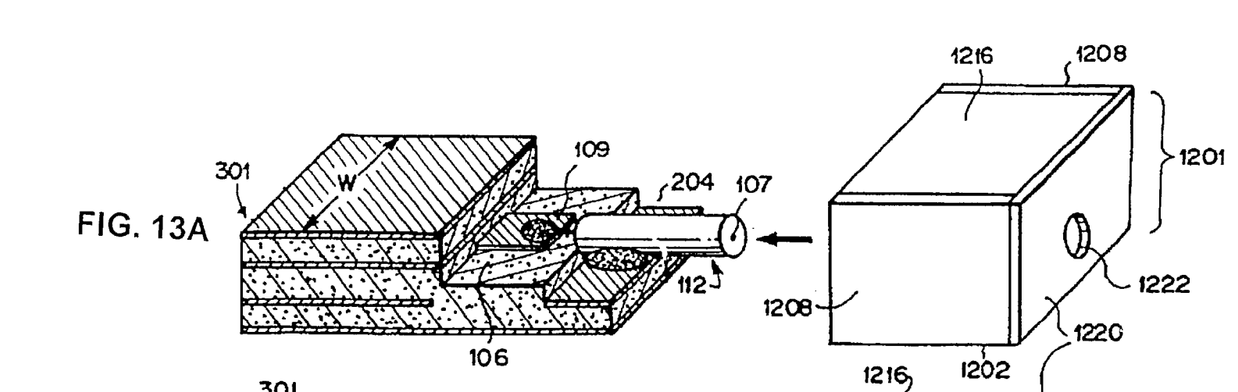
FIGS. 13A to 13C are illustrative views of a metal case covering the radio frequency integrated circuit module shown in FIG. 12A and the vicinities of transmission and reception terminals thereof.
Figures 13B, 13C:
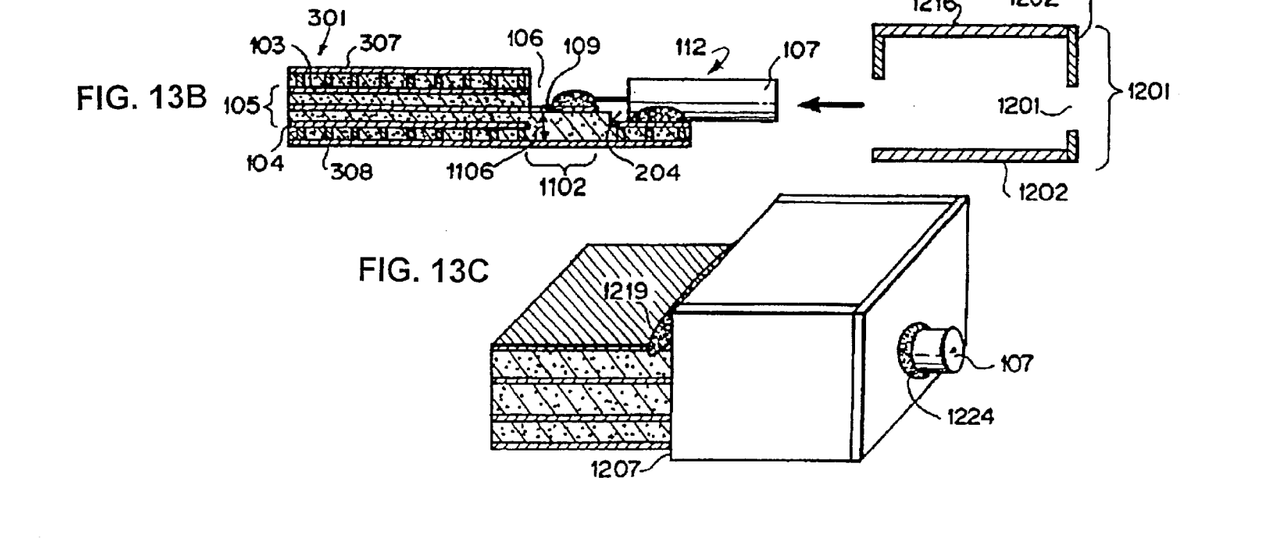

FIG. 13A is an oblique view of the radio frequency integrated circuit module shown in FIG. 6A and a metal case made of, for example, copper that covers the vicinities of transmission and reception terminals of the radio frequency integrated circuit module. FIG. 13B is a sectional view of FIG. 13A in a coaxial line direction. FIG. 13C is a diagram showing such a situation that a metal case 1201 is attached to the radio frequency integrated circuit module in the state of FIG. 13A and they are adhered and fixed to each other by solder.

In the present embodiment, the shape of the metal case 1201 is made different from that of the metal case 701 shown in, for example, FIG. 7A. This aims at making possible matching the characteristic impedance of the strip line 105 and the coaxial line 107 by adjusting the distance between the flat metal plate 1216 and the strip line 105 and the coaxial line 107, even when the thickness and so on of the dielectric cannot be changed, in the same way as the ninth embodiment.

The principle of matching of the characteristic impedance of the strip line 105 and the coaxial line 107 conducted by using the metal case 1201 will now be described. First, the transmission mode in such a section that the exposed connection portion 106 exists therein is considered to be a pseudo TEM (transverse electromagnetic) mode. The characteristic impedance is changed by the following parameters.

In other words, the characteristic impedance is changed by changing any of the width of the exposed portion 109, the thickness of the dielectric, and the distance between the exposed portion 109 and the metal case 701. How to derive the characteristic impedance obtained when those parameters are changed will be described hereafter.

Figure 14:
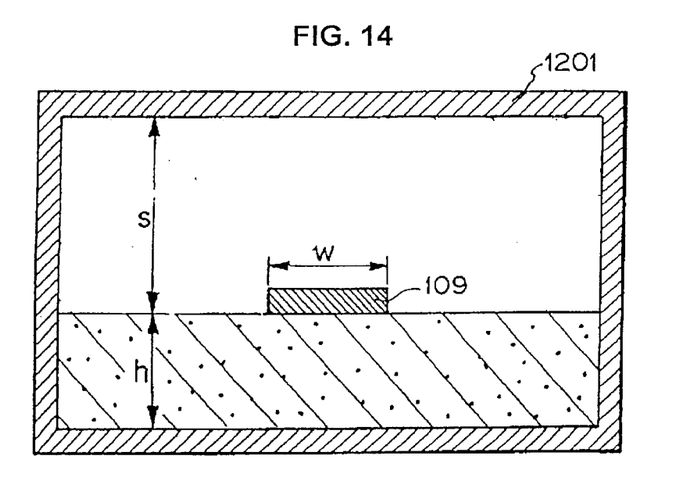
FIG. 14 is a sectional view in a section where an exposed connection portion exists.
Figures 15A, 15B:
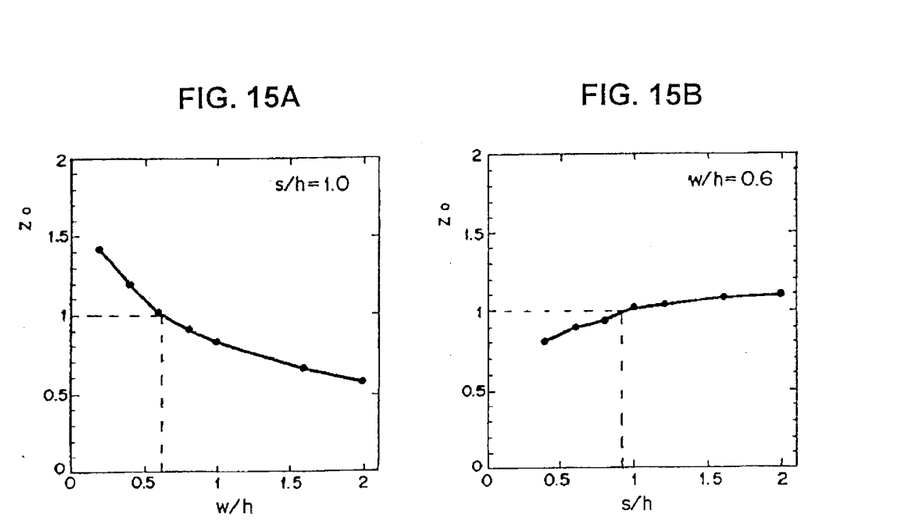
FIG. 15A is a graph showing normalized characteristic impedance $Z_0$ as a function of the width w of an exposed portion/the thickness h of a dielectric.
FIG. 15B is a graph showing a normalized characteristic impedance $Z_0$ as a function of the distance s between the exposed portion and the metal case/the thickness h of the dielectric.

FIG. 14 is a sectional view in the section where the exposed connection portion 106 exists. In FIG. 14, w is the width of the exposed portion 109, h is the thickness of the dielectric, and s is the distance between the exposed section 109 and the metal case 1201. FIG. 15A is a graph showing normalized characteristic impedance $Z_0$ as a function of the width w of the exposed portion 109/the thickness h of the dielectric. FIG. 15B is a graph showing normalized characteristic impedance $Z_0$ as a function of the distance s between the exposed portion 109 and the metal case 1201/the thickness h of the dielectric.

It will be appreciated that the characteristic impedance can be matched as shown in FIG. 15A and FIG. 15B by changing any of the three parameters w, h and s shown in FIG. 14. Furthermore, as shown in FIG. 15A, the characteristic impedance $Z_0$ becomes 1 when, for example, w/h≅0.6. As shown in FIG. 15B, the characteristic impedance $Z_0$ becomes 1 when, for example, s/h≅0.9.

By the way, the normalized characteristic impedance $Z_0$ has been obtained by normalizing with a certain value. Since the basic mode of the transmission line having a section as shown in FIG. 14 is considered to be the pseudo TEM mode, the static electromagnetic field in the section can be easily derived by analyzing with a commercially available electromagnetic simulator or the like.

Here, the second ground 104 is removed and the width of the inner conductor 102 in the section 1102 and the thickness of the dielectric that is in contact with the inner conductor are changed, in the same way as the ninth embodiment. The characteristic impedance in such a section 1102 that the exposed connection portion 106 exists therein is made equal to the characteristic impedance of the strip line 105 and the coaxial line 107. As a result, it becomes possible to accomplish the optimum matching state, suppress unnecessary reflection, and improve the reliability of the transmission characteristics.

Heretofore, respective embodiments have been described by taking a radio frequency integrated circuit having a strip line formed therein as an example. If the metal case 701 or the flat metal plate 901 is made to cover the solder 113, the solder 113 becomes hard to peel off. Therefore, the embodiments can be applied also to a radio frequency integrated circuit having a coplanar line formed so as to interpose a radio frequency signal transmission line between grounds.

Furthermore, a communication apparatus such as a portable telephone or an optical communication apparatus includes a radio frequency signal processor for modulating a speech signal or an optical signal to a radio frequency signal and transmitting the radio frequency signal to another communication apparatus. If the radio frequency integrated circuit module described in each of the embodiments is mounted on the radio frequency signal processor of the communication apparatus, it becomes possible to provide a communication apparatus that is less susceptible to the influence of electromagnetic waves and that is not degraded in electric connection state.

What is claimed is:

1. A radio frequency circuit module which comprises:
   a multi-layer circuit substrate including dielectric layers;
   circuit elements mounted on said multi-layer circuit substrate;
   a co-axial line for connecting said circuit elements;
   a strip line connected with said co-axial line; and
   a cavity that extends part way into said substrate so that a bottom of said cavity is a portion of said substrate,
   wherein said co-axial line is curved to define an arc in said cavity and an inner conductor of said co-axial line is connected with said strip line on the bottom.

2. The radio frequency circuit module according to claim 1, wherein said dielectric layers are made of ceramic or alumina.

3. The radio frequency circuit module according to claim 1, wherein said connection portion is disposed at such a position as to be less susceptible to influence of electromagnetic waves from said circuit elements.

4. A radio frequency circuit module comprising:
   a substrate having ground layers on opposite surfaces thereof;
   a conductive strip line interior to said substrate;
   a cavity that extends part way into said substrate so that a bottom of said cavity is a portion of said substrate, wherein a first surface of said strip line is exposed in said cavity and covers a first part of the bottom of said cavity and the substrate is exposed at a second part of the bottom of said cavity; and
   a co-axial line that extends into said cavity so that an exterior surface of said co-axial line is on the second part of the bottom of said cavity, wherein a connection portion of an inner conductor of said co-axial line is exposed in said cavity and is electrically connected to said first surface of said strip line and an outer conductor of said co-axial line is electrically connected to one of said ground layers.

5. The radio frequency circuit module of claim 4, wherein said substrate comprises one of ceramic and alumina.

* * * * *